(12) United States Patent
Palmteer

(10) Patent No.: US 6,414,246 B1
(45) Date of Patent: Jul. 2, 2002

(54) PRINTED CIRCUIT BOARD (PCB)

(75) Inventor: William J. Palmteer, North Andover, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/966,236

(22) Filed: Sep. 28, 2001

Related U.S. Application Data

(60) Provisional application No. 60/284,028, filed on Apr. 16, 2001.

(51) Int. Cl.[7] .................................................. H05K 1/03
(52) U.S. Cl. ..................... 174/255; 174/256; 174/266; 29/852; 361/767
(58) Field of Search ................................ 174/255, 256, 174/261, 102 SP, 266; 29/852, 830; 361/767

(56) References Cited

U.S. PATENT DOCUMENTS

| | | | | |
|---|---|---|---|---|
| 5,373,629 A | * | 12/1994 | Hupe et al. | 29/852 |
| 6,046,911 A | * | 4/2000 | Dranchak et al. | 361/784 |
| 6,070,785 A | * | 6/2000 | Ameen et al. | 228/115 |

FOREIGN PATENT DOCUMENTS

| | | | | |
|---|---|---|---|---|
| JP | 04026189 A | * | 1/1992 | 134/133 |

* cited by examiner

*Primary Examiner*—Albert W. Paladini

(57) ABSTRACT

A printed circuit board (PCB) is provided for mounting an electronic package thereon. The PCB includes a center pad centrally located in the PCB, a plurality of input/output (I/O) pins peripherally located in the PCB, and at least one slot formed in the center pad for providing escape areas into which contaminants can escape from solder joints associated with mounting of the electronic package onto the PCB.

23 Claims, 4 Drawing Sheets

PRINTED CIRCUIT BOARD (PCB)

RELATED APPLICATION

The present application claims the benefit of priority based on U.S. Provisional Application No. 60/284,028, filed on Apr. 16, 2001, assigned to the same assignee of the present invention, and entitled "Improved Printed Circuit Board (PCB)", which is herein fully incorporated by reference.

FIELD OF THE INVENTION

The present invention relates to printed circuit boards (PCBs) and, more particularly, to a PCB having slots formed at a center pad thereof to prevent formation of voids and residues at solder joint areas and to improve RF grounding characteristics of the PCB.

BACKGROUND OF THE INVENTION

Conventional chip packages such as leadframe-based Chip Scale Packages (CSPs) are soldered onto PCBs using solder paste. Leadframe-based CSPs are CSPs having no peripheral leads that typically extend out from chip packages. A conventional leadframe-based CSP includes a leadframe divided into a die attach. pad centrally located therein and a plurality of wire bonding pads peripherally located therein. The conventional leadframe-based CSP further includes one or more dies or chips mounted on the die attach pad, bonding wires for electrically connecting the dies to the wire bonding pads, and a mold compound for encapsulating all these components in a package structure. A variety of different types of leadframe-based CSPs are available in the market, such as Micro-Lead Packages (MLPs), Micro-Lead-Frames (MLFs), Leadless Package Chip Carriers (LPCC), etc. Joint Electron Device Engineering Counsel (JEDEC), which is a committee for establishing industry standards and packaging outlines, has defined a package outline named "MO-220" for leadframe-based CSPS. This outline classifies the leadframe-based CSPs as HP-VFQFP-Ns or HP-WFQFP-Ns. More information about such packages is available at the website http:/www.jedec.org/home/about jedec.htm.

A conventional PCB is made of conductive layers and dielectric layers stacked up in an alternating manner. The top conductive layer on the PCB is divided into a center pad centrally located therein and a plurality of I/O (input/output) pins peripherally located therein. Typically, solder paste is deposited on certain portions of the center pad and the I/O pins. An electronic package such as a leadframe-based CSP is then placed onto the PCB and fixedly mounted thereon by solder paste. During the mounting of the leadframe-based CSP, the die attach pad of the leadframe-based CSP is aligned with the center pad of the PCB and the wire bonding pads of the leadframe-based CSP are aligned with the I/O pins of the PCB.

FIG. 1 is a plan view of a conventional PCB for mounting an electronic package such as a conventional leadframe-based CSP. As shown in FIG. 1, a conventional leadframe-based PCB 10 includes a center pad 12 centrally located therein and forming a ground plane, a plurality of I/O pins 14 peripherally located therein, and a plurality of metal plated through vias 16 for supplying an electrical ground path for the CSP. Solder paste is selectively applied to the surfaces of the center pad 12 and the I/O pins 14 for soldering the electronic package onto the PCB.

A significant problem arises, however, in such conventional PCBs during the mounting of the electronic package because voids, air bubbles, flux residues and contaminants are introduced at the solder joints, i.e., between the CSP and the surfaces of the PCB, and such contaminants can be entrapped at the solder joints. This problem is more significant in the center pad area than the I/O pin areas because the center pad area involves a larger area to be soldered. The entrapment of the contaminants deteriorates the performance of the PCB and the electronic package. Over a period of time, the entrapped contaminants can lead to a partial or full separation of the electronic package from the PCB, which is a serious problem that must be addressed.

Accordingly, there is a need for an improved PCB that overcomes the above-described solder problems of conventional PCBs.

SUMMARY OF THE INVENTION

The present invention provides an improved PCB that overcomes problems of conventional PCBs. Particularly, the PCB of the present invention provides one or more slots in a center pad of the PCB. These slots function as "escape" areas into which voids, air bubbles, flux residues, and other contaminants can move away from solder joints. Therefore, the solder joint areas are devoid of such contaminants and an electronic package can be soldered onto the PCB effectively.

Accordingly, the present invention is directed to a printed circuit board (PCB) for mounting an electronic package thereon, the PCB comprising a center pad formed on a substrate and located centrally therein, a plurality of input/output (I/O) pins formed on the substrate and peripherally located therein, and at least one slot formed in the center pad for providing escape areas into which contaminants can escape from solder joints associated with mounting of the electronic package on the PCB.

The present invention is further directed to an assembly comprising a printed circuit board (PCB) including a center pad located centrally in the PCB, a plurality of input/output (I/O) pins located peripherally in the PCB, and at least one slot formed in the center pad; and an electronic package mounted on the PCB, wherein the at least one slot provides escape areas into which contaminants can escape from solder joints associated with mounting the electronic package onto the PCB.

Moreover, the present invention is directed to a method of providing a printed circuit board (PCB) for mounting an electronic package thereon, the method comprising the steps of providing a center pad centrally located on a substrate; providing a plurality of input/output (I/O) pins peripherally located on the substrate; and providing at least one slot disposed in the center pad for providing escape areas into which contaminants can escape from solder joints associated with mounting of the electronic package onto the PCB.

DETAILED DESCRIPTION OF THE PREFERRED EMBODIMENTS

Figure 1:
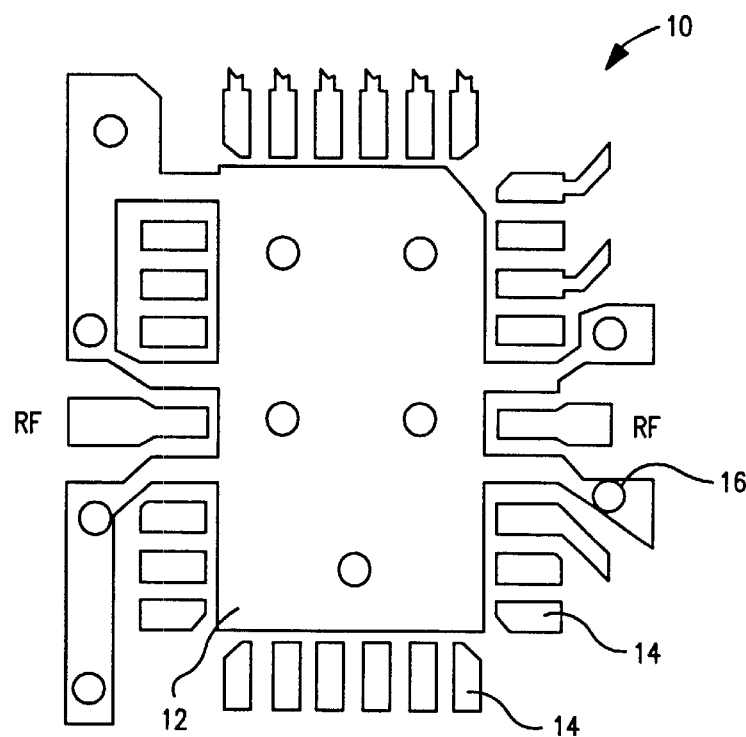
FIG. 1 is a plan view of a conventional PCB.

In the drawings, the same reference numerals are used to indicate the same elements.

Figure 2:
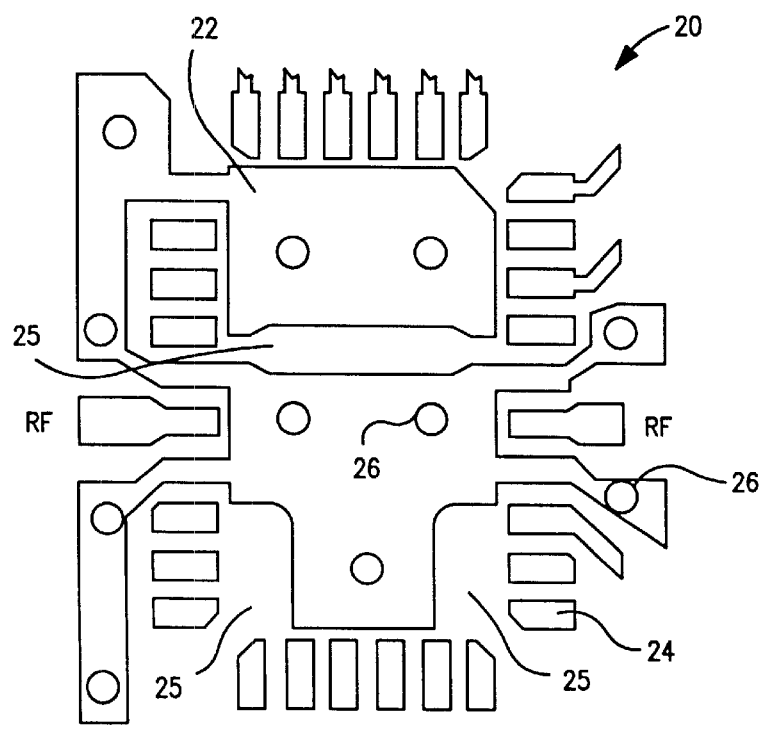
FIG. 2 is a plan view of a PCB according to one embodiment of the present invention.

FIG. 2 is a plan view of a PCB for mounting an electronic package such as a leadframe-based CSP thereon according to one embodiment of the present invention. As shown in FIG. 2, a PCB 20 of the present invention includes a center pad 22 centrally located therein and comprising a ground plane, a plurality of I/O pins 24 peripherally located therein, metal plated vias 26.

The PCB 20 further includes one or more slots 25 formed at the center pad 22. In this example, one of the slots 25 is formed transversely through the middle of the center pad 22, and two of the slots 25 are formed at the bottom, corner end portions of the center pad 22. The slots 25 function as "escape areas" into which voids, air bubbles, flux residues, and other contaminants can move from solder joints during the soldering of an electronic package onto the PCB 20. Since the solder joints will be devoid of such contaminants, this allows the solder paste to fix the electronic package onto the PCB 20 effectively and thereby prevents any separation of the electronic package from the PCB 20.

Furthermore, in some applications such as when the PCB 20 is used in high dynamic range devices (e.g., operating at 30 dB), the slots 25 improve the RF grounding characteristics of such electronic devices. Excessively long ground paths can have the effect of raising the noise level for the high dynamic range devices. By separating the center pad into sections and the grounding areas from each other by forming the slots in the center pad, the present invention provides means for reducing the length of the ground paths and confining the RF ground return currents to specific parts of the PCB. This improves the RF grounding characteristics of the PCB for the high dynamic range devices.

In the present invention, the slots 25 in the center pad of the PCB can be formed in any shape, configuration, or size. For example, the slots 25 can be rectangles, ovals, circles, squares, triangles, or any combination thereof. Further, the slots can be located anywhere in the center pad of the PCB. All these variations are contemplated as part of the present invention.

Figure 3:
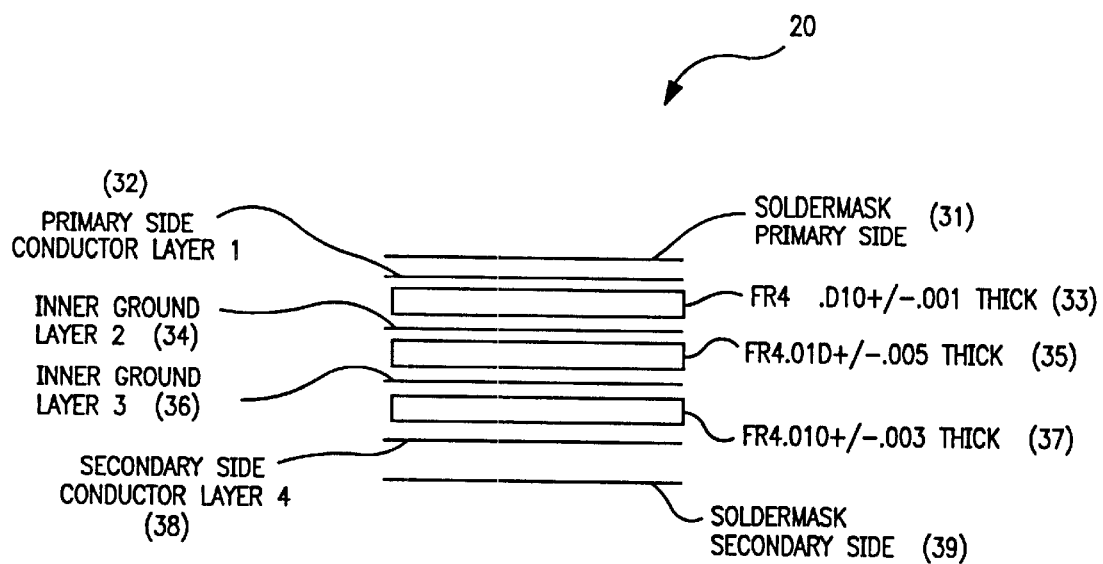
FIG. 3 is a layer view of the PCB of FIG. 2.

FIG. 3 is a detailed layer view of the PCB 20 according to one embodiment of the present invention. As shown in FIG. 3, the PCB 20 is comprised of layers of different materials that are stacked on top of each other. Particularly, in this example, the PCB 20 includes a solder mask 31, a conductive layer 32, a dielectric layer 33, a ground layer 34, a dielectric layer 35, a ground layer 36, a dielectric layer 37, a conductive layer 38, and a solder mask 39. The conductive layer 32, in this example, is the layer onto which the electronic package is soldered.

In one embodiment, the slots 25 are formed only through the solder mask 31 and the conductive layer 32. This can be accomplished using known etching processes. Since the conductive layer 32 and the solder mask 31 are made of different materials, different etchants are used to form the slots 25, and the conductive layer 32 and the solder mask 31 may be etched separately at different times.

One skilled in the art would readily understand that the layer structure for the PCB shown in FIG. 3 is one example, and that other layers and layer structures can be used for the purposes of the present invention as long as the slots 25 are formed in the conductive layer onto which the chip package is to be mounted.

Figure 4:
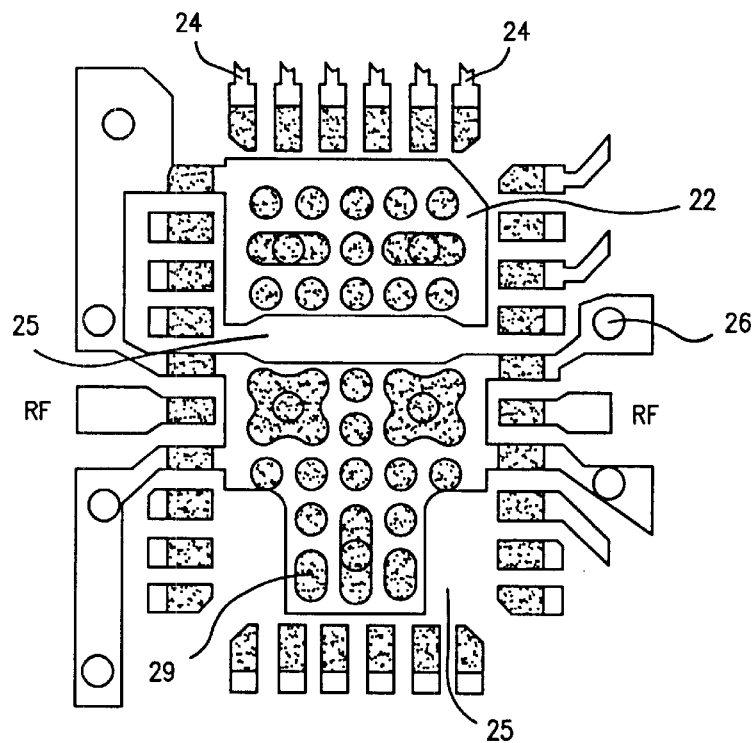
FIG. 4 is a plan view of the PCB of FIG. 2 illustrating solder depositions according to one embodiment of the present invention.

FIG. 4 is a plan view of the PCB of FIG. 2 illustrating solder depositions according to one embodiment of the present invention. As shown in FIG. 4, a solder paste 29 is applied selectively on certain portions of the center pad 22 and the I/O pins 24. To provide escape areas for contaminants in or near the deposited solder paste 29, no solder paste is deposited over the areas of the slots 25. This allows any voids, air bubbles or other contaminants (e.g., dusts) associated with the solder paste 29 deposited near the slots 25 at solder joint areas to escape and move into the slots 25 so that the solder joint areas are devoid of such contaminants.

Figure 5:
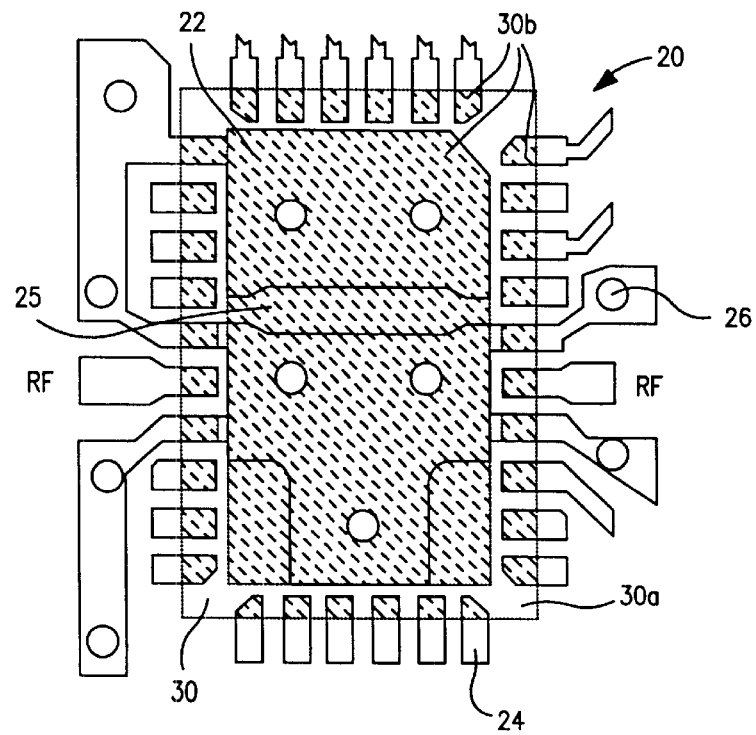
FIG. 5 is a plan view of the PCB of FIG. 2 illustrating an outline of an electronic package according to one embodiment of the present invention.

FIG. 5 is a plan view of the PCB of FIG. 2 illustrating an outline of an electronic package according to one embodiment of the present invention As shown in FIG. 5, an electronic package 30 is soldered onto the PCB 20. In the Figure, the package 30 is not actually shown since it would obscure pertinent aspects of the invention. Rather, its outline is shown by rectangular outline 30a and the base metal portions of the package are illustrated by the areas 30b that are cross-hatched. The electronic package 30 is a conventional electronic package such as a conventional leadframe-based CSP or any other thermally enhanced chip package. The die attach pad of the electronic package is aligned with the center pad 22 of the PCB 20 with the wire bonding pads of the electronic package aligned with the I/O pins 24 of the PCB 20 as well known in the art. By providing the slot(s) 25 in the center pad 22, the electronic package 30 can be soldered to the PCB 20 effectively, thereby improving the overall appearance and performance of the package 30 mounted on the PCB 20.

Figure 6:
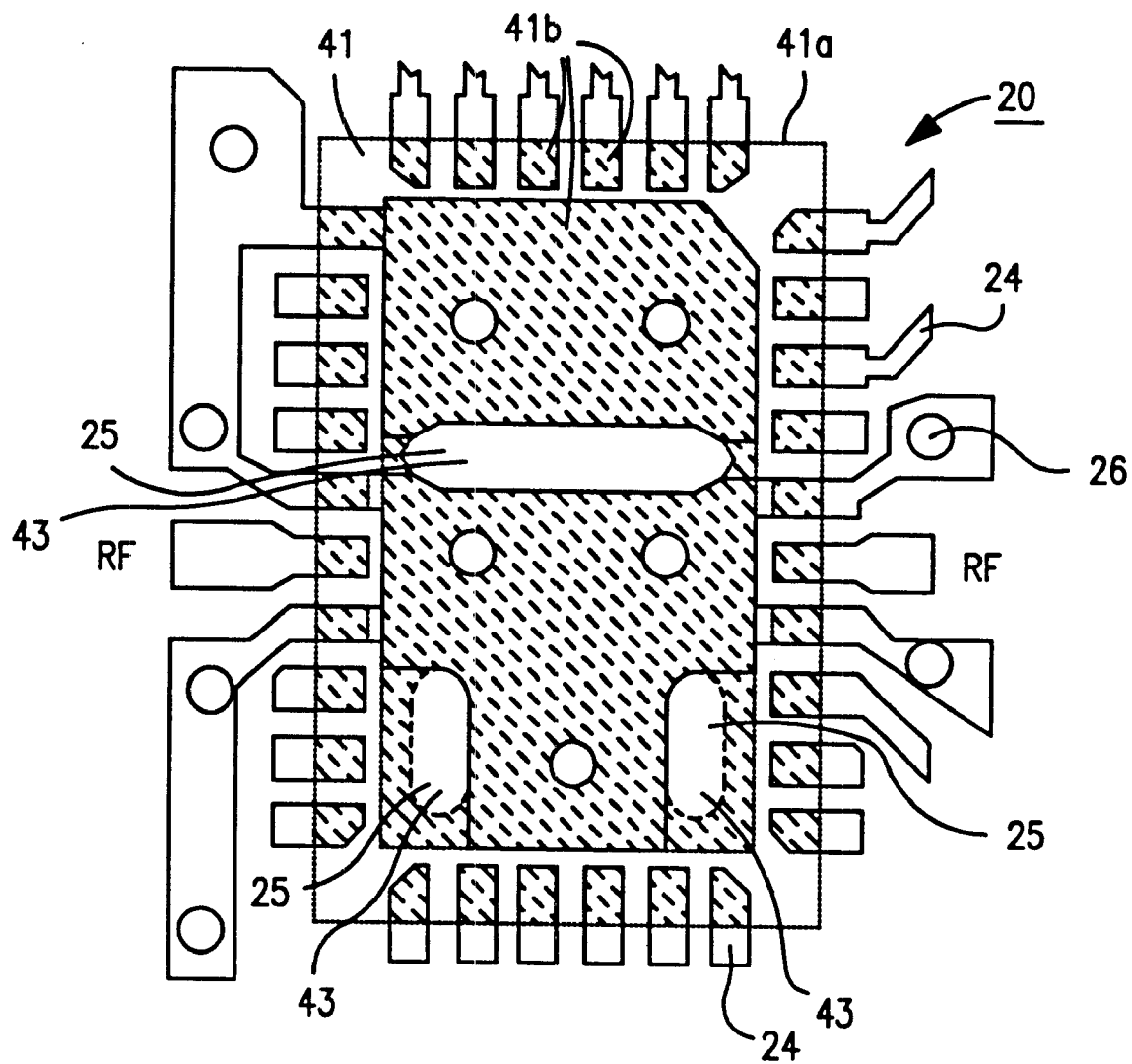
FIG. 6 is a plan view of the PCB of FIG. 2 illustrating an outline of a different electronic package according to another embodiment of the present invention.

FIG. 6 is a plan view of the PCB of FIG. 2 illustrating an outline of a different electronic package according to another embodiment of the present invention. As shown in FIG. 6, an electronic package 41 is soldered onto the PCB 20. Again, in FIG. 4, the package 41 is not actually shown since it would obscure pertinent aspects of the invention. Rather, its outline is shown by rectangular outline 41 a and the base metal portions of the package are illustrated by the areas 41b that are cross-hatched.

This electronic package 41 differs from a conventional electronic package in that it contains one or more apertures 43 that will be filled with the mold compound when the assembly is encapsulated. The aperture(s) 43 increase an adhesion surface area for the mold compound in the electronic package 41, which improves the reliability and electrical characteristics of the package 41 by enhancing the adhesion process of the mold compound. The electronic package 41 is well described in U.S. Provisional Application No. 6/0,284,029, entitled "Improved Leadframe-based Chip Scale Package" filed on Apr., 16, 2001, and owned by the same assignee of the present invention, which is herein fully incorporated by reference.

In this embodiment, the slots 25 of the PCB 20 are formed to align with the apertures 43 of the electronic package 41 so as to further enhance the effects of the slots 25.

Although a few different types of electronic packages have been described for use with the PCB of the present invention, the PCB of the present invention can be used to mount any electronic package thereon.

Accordingly, the present invention provides one or more slots in the PCB for allowing voids, flux resides, air bubbles, and other contaminants to escape from solder joints into these slots. This allows continuous and effective soldering to occur between the PCB and any electronic packages soldered to the PCB. Further, the present invention improves the RF grounding characteristics of the PCB.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A printed circuit board (PCB) for mounting an electronic package thereon, the PCB comprising:

a center pad formed on a substrate and located centrally therein;

a plurality of input/output (I/O) pins formed on the substrate and peripherally located therein; and at least one slot formed in the center pad for providing escape areas into which contaminants can escape from solder joints associated with mounting of the electronic package on the PCB.

2. The PCB of claim 1, wherein the contaminants include at least one of the following: voids, air bubbles, flux residues, and dusts.

3. The PCB of claim 1, wherein the center pad includes:

a dielectric layer formed on the substrate;

a conductive layer formed on the dielectric layer; and a solder mask formed on the conductive layer; and wherein the at least one slot is formed through the solder mask and the conductive layer.

4. The PCB of claim 3, wherein the at least one slot is not formed through the dielectric layer.

5. The PCB of claim 1, further comprising:

at least first and second grounding areas formed at the center pad and corresponding to components of the electronic package, wherein the at least one slot is formed between the first and second grounding areas.

6. The PCB of claim 1, further comprising:

a solder paste applied on certain portions of the PCB, except for areas over the at least one slot.

7. The PCB of claim 1, wherein the shape of the at least one slot is one of a rectangle, a square, an oval, a triangle, a circle, and a combination thereof.

8. An assembly comprising:

a printed circuit board (PCB) including,
   a center pad located centrally in the PCB,
   a plurality of input/output (I/O) pins located peripherally in the PCB, and
   at least one slot formed in the center pad;

an electronic package mounted on the PCB;

solder joints attaching the electronic package to the PCB, and wherein the at least one slot provides escape areas into which contaminants can escape from solder joints associated with mounting the electronic package onto the PCB.

9. The assembly of claim 8, wherein the contaminants include at least one of: voids, air bubbles, flux residues, and dusts.

10. The assembly of claim 8, wherein the center pad of the PCB includes:

a dielectric layer;

a conductive layer formed on the dielectric layer; and a solder mask formed on the conductive layer; and wherein the at least one slot is formed through the solder mask and the conductive layer.

11. The assembly of claim 10, wherein the at least one slot is not formed through the dielectric layer.

12. The assembly of claim 8, wherein the PCB further includes:

at least first and second grounding areas formed in the center pad and corresponding to components of the electronic package, wherein the at least one slot is formed between the first and second grounding areas.

13. The assembly of claim 8, further comprising:

a solder paste applied on certain portions of the PCB, except for areas over the at least one slot, for mounting the electronic package onto the PCB.

14. The assembly of claim 8, wherein the electronic package is a leadframe-based Chip Scale Package (CSP).

15. The assembly of claim 14, wherein the leadframe-based CSP includes a die attach pad having at least one aperture formed therein for increasing an adhesion surface area for a mold compound.

16. The assembly of claim 15, wherein the at least one slot of the PCB is aligned substantially with the at least one aperture of the leadframe-based CSP.

17. A method of providing a printed circuit board (PCB) for mounting an electronic package thereon, the method comprising the steps of:

providing a center pad centrally located on a substrate;

providing a plurality of input/output (I/O) pins peripherally located on the substrate; and providing at least one slot disposed in the center pad for providing escape areas into which contaminants can escape from solder joints associated with mounting of the electronic package onto the PCB.

18. The method of claim 17, wherein the contaminants include at least one of the following: voids, air bubbles, flux residues, and dusts.

19. The method of claim 17, wherein the step of providing the center pad includes:

providing a dielectric layer on the substrate;

providing a conductive layer on the dielectric layer; and providing a solder mask on the conductive layer; and wherein the at least one slot is formed through the solder mask and the conductive layer.

20. The method of claim 19, wherein the at least one slot is not formed through the dielectric layer.

21. The method of claim 17, further comprising:

providing at least first and second grounding areas disposed in the center pad and corresponding to components of the electronic package, wherein the at least one slot is formed between the first and second grounding areas.

22. The method of claim 17, further comprising:

applying a solder paste on portions of the PCB for mounting the electronic package onto the PCB, excluding areas over the at least one slot.

23. The method of claim 17, wherein the shape of the at last one slot is one of a rectangle, a square, an oval, a triangle, a circle, and a combination thereof.

* * * * *